United States Patent
Choi et al.

(10) Patent No.: US 6,942,753 B2
(45) Date of Patent: *Sep. 13, 2005

(54) GAS DISTRIBUTION PLATE ASSEMBLY FOR LARGE AREA PLASMA ENHANCED CHEMICAL VAPOR DEPOSITION

(75) Inventors: Soo Young Choi, Fremont, CA (US); Quanyuan Shang, Saratoga, CA (US); Robert I. Greene, Fremont, CA (US); Li Hou, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/417,592

(22) Filed: Apr. 16, 2003

(65) Prior Publication Data

US 2004/0206305 A1 Oct. 21, 2004

(51) Int. Cl.[7] .............. C23C 16/00; C23C 16/452; C23F 1/00; H01L 21/00
(52) U.S. Cl. .............. 156/345.34; 156/345.33; 118/715
(58) Field of Search .............. 118/715; 156/345.33, 156/345.34

(56) References Cited

U.S. PATENT DOCUMENTS

| | | | |
|---|---|---|---|
| 4,262,631 A | 4/1981 | Kubacki | 118/723 |
| 4,532,150 A | 7/1985 | Endo et al. | 427/39 |
| 4,634,601 A | 1/1987 | Hamakawa et al. | 427/39 |
| 4,759,947 A | 7/1988 | Ishihara et al. | 427/38 |
| 4,792,378 A | 12/1988 | Rose et al. | |
| 4,892,753 A | 1/1990 | Wang et al. | |
| 5,000,113 A | 3/1991 | Wang et al. | |
| 5,238,866 A | 8/1993 | Bolz et al. | 437/100 |
| 5,304,248 A * | 4/1994 | Cheng et al. | 118/728 |

(Continued)

FOREIGN PATENT DOCUMENTS

| | | | |
|---|---|---|---|
| EP | 0 613 178 | 8/1994 | H01L 21/90 |
| EP | 1 118 693 | 7/2001 | |
| WO | WO 01/75188 | 10/2001 | |

OTHER PUBLICATIONS

PCT Invitation To Pay Additional Fees dated Aug. 19, 2004.
International Search Report dated Oct. 26, 2004 for corresponding PCT Application, PCT/US03/41508.
Rader, et al., "Showerhead–enhanced inertial particle deposition in parallel–plate reactors," Aerosol Science and Technology, 1998, V28, N2 (Feb), p105–132.
PCT Search Report dated Dec. 27, 2004 for International Application No. PCT/US2004/011477.

*Primary Examiner*—Jeffrie R. Lund
(74) *Attorney, Agent, or Firm*—Moser, Patterson & Sheridan LLP

(57) ABSTRACT

Embodiments of a gas distribution plate for distributing gas in a processing chamber are provided. In one embodiment, a gas distribution plate includes a diffuser plate having a plurality of gas passages passing between an upstream side and a downstream side of the diffuser plate. At least one of the gas passages includes a first hole and a second hole coupled by an orifice hole. The first hole extends from the upstream side of the diffuser plate while the second hole extends from the downstream side. The orifice hole has a diameter less than the respective diameters of the first and second holes.

23 Claims, 5 Drawing Sheets

U.S. PATENT DOCUMENTS

| | | | |
|---|---|---|---|
| 5,362,526 A | | 11/1994 | Wang et al. |
| 5,465,680 A | | 11/1995 | Loboda ........................ 117/84 |
| 5,589,002 A | | 12/1996 | Su |
| 5,595,606 A | * | 1/1997 | Fujikawa et al. ............ 118/725 |
| 5,624,498 A | * | 4/1997 | Lee et al. .................... 118/715 |
| 5,643,394 A | | 7/1997 | Maydan et al. |
| 5,711,987 A | | 1/1998 | Bearinger et al. .............. 427/7 |
| 5,730,792 A | | 3/1998 | Camilletti et al. ..... 106/287.14 |
| 5,746,875 A | | 5/1998 | Maydan et al. |
| 5,755,886 A | | 5/1998 | Wang et al. |
| 5,776,235 A | | 7/1998 | Camilletti et al. ....... 106/287.1 |
| 5,780,163 A | | 7/1998 | Camilletti et al. .......... 428/446 |
| 5,818,071 A | | 10/1998 | Loboda et al. ................ 257/77 |
| 5,882,411 A | * | 3/1999 | Zhao et al. .................. 118/715 |
| 5,964,947 A | * | 10/1999 | Zhao et al. .................. 118/715 |
| 6,007,633 A | | 12/1999 | Kitamura et al. |
| 6,024,799 A | | 2/2000 | Chen et al. |
| RE36,623 E | | 3/2000 | Wang et al. |
| 6,054,379 A | | 4/2000 | Yau et al. .................... 438/623 |
| 6,072,227 A | | 6/2000 | Yau et al. .................... 257/642 |
| 6,080,446 A | | 6/2000 | Tobe et al. ........... 427/255.394 |
| 6,110,287 A | | 8/2000 | Arai et al. |
| 6,126,753 A | | 10/2000 | Shinriki et al. ............. 118/715 |
| 6,132,512 A | | 10/2000 | Horie et al. |
| 6,140,226 A | | 10/2000 | Grill et al. ................... 438/637 |
| 6,147,009 A | | 11/2000 | Grill et al. ................... 438/780 |
| 6,159,871 A | | 12/2000 | Loboda et al. .............. 438/786 |
| 6,167,834 B1 | | 1/2001 | Wang et al. |
| 6,206,972 B1 | | 3/2001 | Dunham |
| 6,230,651 B1 | | 5/2001 | Ni et al. |
| 6,263,829 B1 | | 7/2001 | Schnieder et al. |
| 6,284,673 B2 | | 9/2001 | Dunham |
| 6,287,990 B1 | | 9/2001 | Cheung et al. .............. 438/780 |
| 6,303,523 B2 | | 10/2001 | Cheung et al. .............. 438/780 |
| 6,340,435 B1 | | 1/2002 | Bjorkman et al. ............ 216/72 |
| 6,348,725 B2 | | 2/2002 | Cheung et al. .............. 257/642 |
| 6,368,450 B2 | | 4/2002 | Hayashi |
| 6,413,583 B1 | | 7/2002 | Moghadam et al. ... 427/249.15 |
| 6,454,860 B2 | * | 9/2002 | Metzner et al. ............. 118/715 |
| 6,461,435 B1 | * | 10/2002 | Littau et al. ................. 118/715 |
| 6,511,903 B1 | * | 1/2003 | Yau et al. .................... 438/623 |
| 6,511,909 B1 | * | 1/2003 | Yau et al. .................... 438/638 |
| 6,537,929 B1 | * | 3/2003 | Cheung et al. .............. 438/790 |
| 6,541,282 B1 | * | 4/2003 | Cheung et al. ................. 438/5 |
| 6,562,690 B1 | * | 5/2003 | Cheung et al. .............. 438/400 |
| 6,565,661 B1 | * | 5/2003 | Nguyen ...................... 118/715 |
| 6,593,247 B1 | * | 7/2003 | Huang et al. ................ 438/758 |
| 6,596,655 B1 | * | 7/2003 | Cheung et al. .............. 438/789 |
| 6,627,532 B1 | * | 9/2003 | Gaillard et al. ............. 438/623 |
| 6,638,392 B2 | * | 10/2003 | Yamamoto et al. .... 156/345.41 |
| 6,641,673 B2 | * | 11/2003 | Yang .......................... 118/715 |
| 6,660,663 B1 | * | 12/2003 | Cheung et al. .............. 438/789 |
| 6,772,827 B2 | | 8/2004 | Keller et al. |
| 6,793,733 B2 | * | 9/2004 | Janakiraman et al. ....... 118/715 |
| 2001/0054381 A1 | * | 12/2001 | Umotoy et al. ............. 118/715 |
| 2002/0000670 A1 | | 1/2002 | Yau et al. .................... 257/759 |
| 2002/0017243 A1 | | 2/2002 | Pyo ............................ 118/715 |
| 2002/0045361 A1 | | 4/2002 | Cheung et al. .............. 438/790 |
| 2002/0129769 A1 | * | 9/2002 | Kim et al. ............... 118/723 E |
| 2003/0019580 A1 | | 1/2003 | Strang |
| 2003/0207033 A1 | | 11/2003 | Yim et al. |
| 2004/0129211 A1 | * | 7/2004 | Blonigan et al. ........... 118/715 |
| 2004/0173313 A1 | * | 9/2004 | Beach .................... 156/345.33 |

\* cited by examiner

GAS DISTRIBUTION PLATE ASSEMBLY FOR LARGE AREA PLASMA ENHANCED CHEMICAL VAPOR DEPOSITION

BACKGROUND OF THE DISCLOSURE

1. Field of the Invention

Embodiments of the invention generally relate to a gas distribution plate assembly and method for distributing gas in a processing chamber.

2. Description of the Background Art

Liquid crystal displays or flat panels are commonly used for active matrix displays such as computer and television monitors. Generally, flat panels comprise two glass plates having a layer of liquid crystal material sandwiched therebetween. At least one of the glass plates includes at least one conductive film disposed thereon that is coupled to a power supply. Power supplied to the conductive film from the power supply changes the orientation of the crystal material, creating a pattern such as text or graphics seen on the display. One fabrication process frequently used to produce flat panels is plasma enhanced chemical vapor deposition (PECVD).

Plasma enhanced chemical vapor deposition is generally employed to deposit thin films on a substrate such as a flat panel or semiconductor wafer. Plasma enhanced chemical vapor deposition is generally accomplished by introducing a precursor gas into a vacuum chamber that contains a flat panel. The precursor gas is typically directed downwardly through a distribution plate situated near the top of the chamber. The precursor gas in the chamber is energized (e.g., excited) into a plasma by applying RF power to the chamber from one or more RF sources coupled to the chamber. The excited gas reacts to form a layer of material on a surface of the flat panel that is positioned on a temperature controlled substrate support. In applications where the flat panel receives a layer of low temperature polysilicon, the substrate support may be heated in excess of 400 degrees Celsius. Volatile by-products produced during the reaction are pumped from the chamber through an exhaust system.

Flat panels processed by PECVD techniques are typically large, often exceeding 370 mm×470 mm and ranging over 1 square meter in size. Large area substrates approaching and exceeding 4 square meters are envisioned in the near future. Gas distribution plates utilized to provide uniform process gas flow over flat panels are proportionally large in size, particularly as compared to gas distribution plates utilized for 200 mm and 300 mm semiconductor wafer processing.

Large gas distribution plates utilized for flat panel processing have a number of fabricating issues that result in high manufacturing costs. For example, gas flow holes formed through the gas distribution plate are small in diameter relative to thickness of the gas distribution plate, for examples a 0.062 diameter hole through a 1.2 inch thick plate, resulting in a high frequency of drill bit breakage during hole formation. Removal of broken drill bits is time consuming and may result in the entire gas distribution plate being scrapped. Additionally, as the number of gas flow holes formed through the gas distribution plate is proportional to the size of the flat panel, the great number of holes formed in each plate disadvantageously contributes to a high probability of trouble during plate fabrication. Moreover, the high number of holes coupled with the care required to minimize drill bit breakage results in long fabrication times, thereby elevating fabrication costs.

As the cost of materials and manufacturing the gas distribution plate is great, it would be advantageous to develop a gas distribution plate in a configuration that can be efficiently and cost effectively fabricated. Moreover, as the size of the next generation gas distribution plates is increased to accommodate processing flat panels in excess of 1.2 square meters, resolution of the aforementioned problems becomes increasingly important to resolve.

While addressing the cost implications of the design of large gas distribution plates is important, performance attributes must not be overlooked. For example, the configuration, location and density of gas flow holes directly impact deposition performance, such as deposition uniformity and cleaning attributes. For example, if the gas flow holes formed through the gas distribution plate create too much backpressure, disassociated fluorine utilized to clean the plate has an increased propensity to recombine, disadvantageously diminishing cleaning effectiveness. Moreover, as fluorine is typically a film contaminant, the surface area of the gas distribution plate should be configured to encourage good flow therethrough while providing minimal area for fluorine adherence to the plate.

Therefore, there is a need for an improved gas distribution plate assembly.

SUMMARY OF THE INVENTION

Embodiments of a gas distribution plate for distributing gas in a processing chamber are provided. In one embodiment, a gas distribution plate includes a diffuser plate having a plurality of gas passages passing between an upstream side and a downstream side of the diffuser plate. At least one of the gas passages includes a first hole and a second hole coupled by an orifice hole. The first hole extends from the upstream side of the diffuser plate while the second hole extends from the downstream side. The orifice hole has a diameter less than either of the respective diameters of the first and second holes.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the Figures.

DETAILED DESCRIPTION

The invention generally provides a gas distribution plate assembly for providing gas delivery within a processing chamber. The invention is illustratively described below in reference to a plasma enhanced chemical vapor deposition system configured to process large area substrates, such as a plasma enhanced chemical vapor deposition (PECVD) system, available from AKT, a division of Applied Materials, Inc., Santa Clara, Calif. However, it should be understood that the invention has utility in other system configurations such as etch systems, other chemical vapor deposition systems and any other system in which distributing gas within a process chamber is desired, including those systems configured to process round substrates.

Figure 1:
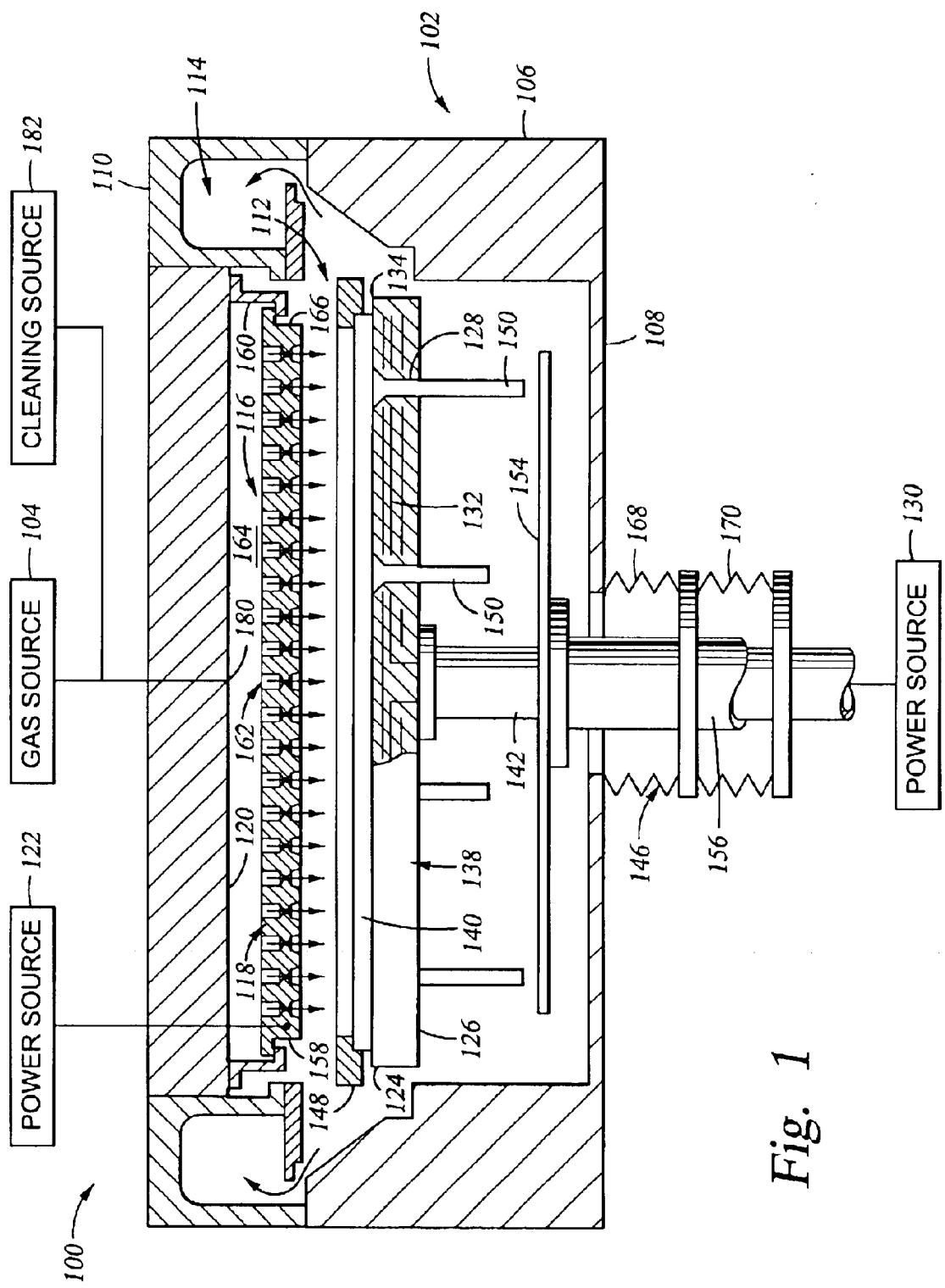
FIG. 1 is a schematic sectional view of an illustrative processing chamber having one embodiment of a gas distribution plate assembly of the present invention.

FIG. 1 is a cross sectional view of one embodiment of a plasma enhanced chemical vapor deposition system 100. The system 100 generally includes a processing chamber 102 coupled to a gas source 104. The processing chamber 102 has walls 106 and a bottom 108 that partially define a process volume 112. The process volume 112 is typically accessed through a port (not shown) in the walls 106 that facilitates movement of a substrate 140 into and out of the processing chamber 102. The walls 106 and bottom 108 are typically fabricated from a unitary block of aluminum or other material compatible for processing. The walls 106 support a lid assembly 110 that contains a pumping plenum 114 that couples the process volume 112 to an exhaust port (that includes various pumping components, not shown).

A temperature controlled substrate support assembly 138 is centrally disposed within the processing chamber 102. The support assembly 138 supports the glass substrate 140 during processing. In one embodiment, the substrate support assembly 138 comprises an aluminum body 124 that encapsulates at least one embedded heater 132.

The heater 132, such as a resistive element, disposed in the support assembly 138, is coupled to a power source 130 and controllably heats the support assembly 138 and the glass substrate 140 positioned thereon to a predetermined temperature. Typically, in a CVD process, the heater 132 maintains the glass substrate 140 at a uniform temperature between about 150 to at least about 460 degrees Celsius, depending on the deposition processing parameters for the material being deposited.

Generally, the support assembly 138 has a lower side 126 and an upper side 134. The upper side 134 supports the glass substrate 140. The lower side 126 has a stem 142 coupled thereto. The stem 142 couples the support assembly 138 to a lift system (not shown) that moves the support assembly 138 between an elevated processing position (as shown) and a lowered position that facilitates substrate transfer to and from the processing chamber 102. The stem 142 additionally provides a conduit for electrical and thermocouple leads between the support assembly 138 and other components of the system 100.

A bellows 146 is coupled between support assembly 138 (or the stem 142) and the bottom 108 of the processing chamber 102. The bellows 146 provides a vacuum seal between the chamber volume 112 and the atmosphere outside the processing chamber 102 while facilitating vertical movement of the support assembly 138.

The support assembly 138 generally is grounded such that RF power supplied by a power source 122 to a gas distribution plate assembly 118 positioned between the lid assembly 110 and substrate support assembly 138 (or other electrode positioned within or near the lid assembly of the chamber) may excite gases present in the process volume 112 between the support assembly 138 and the distribution plate assembly 118. The RF power from the power source 122 is generally selected commensurate with the size of the substrate to drive the chemical vapor deposition process.

The support assembly 138 additionally supports a circumscribing shadow frame 148. Generally, the shadow frame 148 prevents deposition at the edge of the glass substrate 140 and support assembly 138 so that the substrate does not stick to the support assembly 138.

The support assembly 138 has a plurality of holes 128 disposed therethrough that accept a plurality of lift pins 150. The lift pins 150 are typically comprised of ceramic or anodized aluminum. Generally, the lift pins 150 have first ends that are substantially flush with or slightly recessed from an upper side 134 of the support assembly 138 when the lift pins 150 are in a normal position (i.e., retracted relative to the support assembly 138). The first ends are typically flared to prevent the lift pins 150 from falling through the holes 128. Additionally, the lift pins 150 have a second end that extends beyond the lower side 126 of the support assembly 138. The lift pins 150 may be actuated relative to the support assembly 138 by a lift plate 154 to project from the support surface 134, thereby placing the substrate in a spaced-apart relation to the support assembly 138.

The lift plate 154 is disposed between the lower side 126 of the substrate support assembly 138 and the bottom 108 of the processing chamber 102. The lift plate 154 is connected to an actuator (not shown) by a collar 156 that circumscribes a portion of the stem 142. The bellows 146 includes an upper portion 168 and a lower portion 170 that allows the stem 142 and collar 156 to move independently while maintaining the isolation of the process volume 112 from the environment exterior to the processing chamber 102. Generally, the lift plate 154 is actuated to cause the lift pins 150 to extend from the upper side 134 as the support assembly 138 and the lift plate 154 move closer together relative to one another.

The lid assembly 110 provides an upper boundary to the process volume 112. The lid assembly 110 typically can be removed or opened to service the processing chamber 102. In one embodiment, the lid assembly 110 is fabricated from aluminum.

The lid assembly 110 includes a pumping plenum 114 formed therein coupled to an external pumping system (not shown). The pumping plenum 114 is utilized to channel gases and processing by-products uniformly from the process volume 112 and out of the processing chamber 102.

The lid assembly 110 typically includes an entry port 180 through which process gases provided by the gas source 104 are introduced into the processing chamber 102. The entry port 180 is also coupled to a cleaning source 182. The cleaning source 182 typically provides a cleaning agent, such as disassociated fluorine, that is introduced into the processing chamber 102 to remove deposition byproducts and films from processing chamber hardware, including the gas distribution plate assembly 118.

The gas distribution plate assembly 118 is coupled to an interior side 120 of the lid assembly 110. The gas distribution plate assembly 118 is typically configured to substantially follow the profile of the glass substrate 140, for example, polygonal for large area substrates and circular for wafers. The gas distribution plate assembly 118 includes a perforated area 116 through which process and other gases supplied from the gas source 104 are delivered to the process volume 112. The perforated area 116 of the gas distribution plate assembly 118 is configured to provide uniform distribution of gases passing through the gas distribution plate assembly 118 into the processing chamber 102. One gas distribution plate that may be adapted to benefit from the invention is described in U.S. patent application Ser. No. 09/922,219, filed Aug. 8, 2001 by Keller et al.; U.S. Ser. No. 10/140,324, filed May 6, 2002; and U.S. Ser. No. 10/337,483, filed Jan. 7, 2003 by Blonigan et al.; and U.S. Pat. No. 6,477,980, issued Nov. 12, 2002 to White et al., which are hereby incorporated by reference in their entireties.

Figure 3:
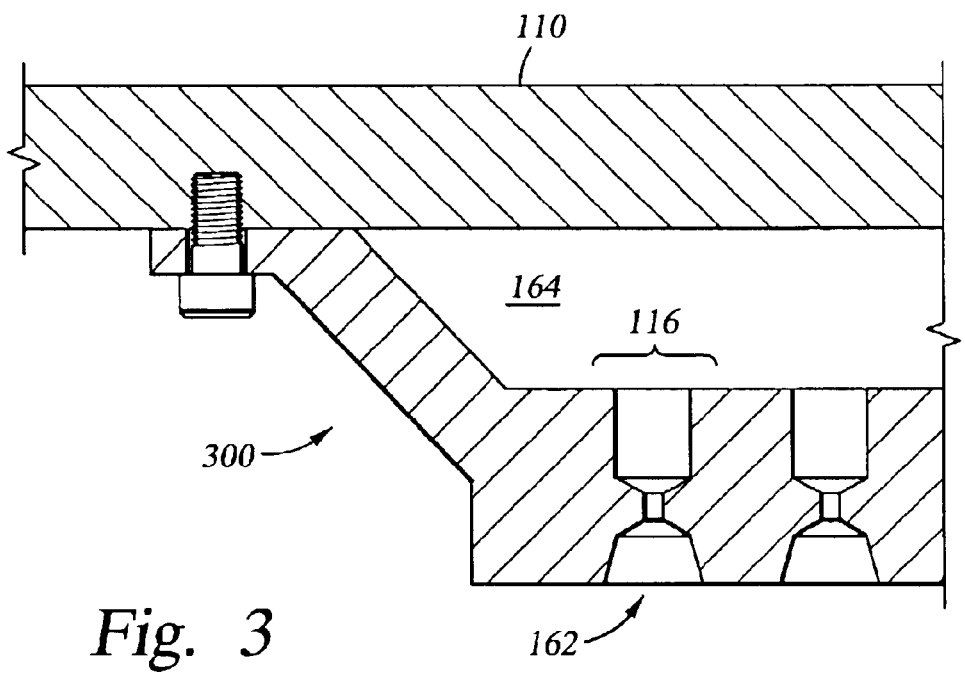
FIG. 3 is partial sectional view of another embodiment of a gas distribution plate assembly.

The gas distribution plate assembly 118 typically includes a diffuser plate 158 suspended from a hanger plate 160. The diffuser plate 158 and hanger plate 160 may alternatively comprise a single unitary member (as shown by the gas distribution plate assembly 300 depicted in FIG. 3). A plurality of gas passages 162 are formed through the diffuser plate 158 to allow a predetermined distribution of gas passing through the gas distribution plate assembly 118 and into the process volume 112. The hanger plate 160 maintains the diffuser plate 158 and the interior surface 120 of the lid assembly 110 in a spaced-apart relation, thus defining a plenum 164 therebetween. The plenum 164 allows gases flowing through the lid assembly 110 to uniformly distribute across the width of the diffuser plate 158 so that gas is provided uniformly above the center perforated area 116 and flows with a uniform distribution through the gas passages 162.

The hanger plate 160 is typically fabricated from stainless steel, aluminum, or nickel or other RF conductive material. The hanger plate 160 includes a central aperture 166 that facilitates unobstructed gas flow through the hanger plate 160 from the gas entry port 180 formed in the lid assembly 110 and through the gas passages 162 of the diffuser plate 158. The hanger plate 160 generally provides a mounting surface for coupling the diffuser plate 158 to the lid assembly 110 or chamber walls 106.

The diffuser plate 158 is typically fabricated from stainless steel, aluminum, nickel or other RF conductive material. The diffuser plate 158 is configured with a thickness that maintains sufficient flatness across the aperture 166 as not to adversely affect substrate processing. In one embodiment the diffuser plate 158 has a thickness of about 1.2 inches thick.

Figure 2:
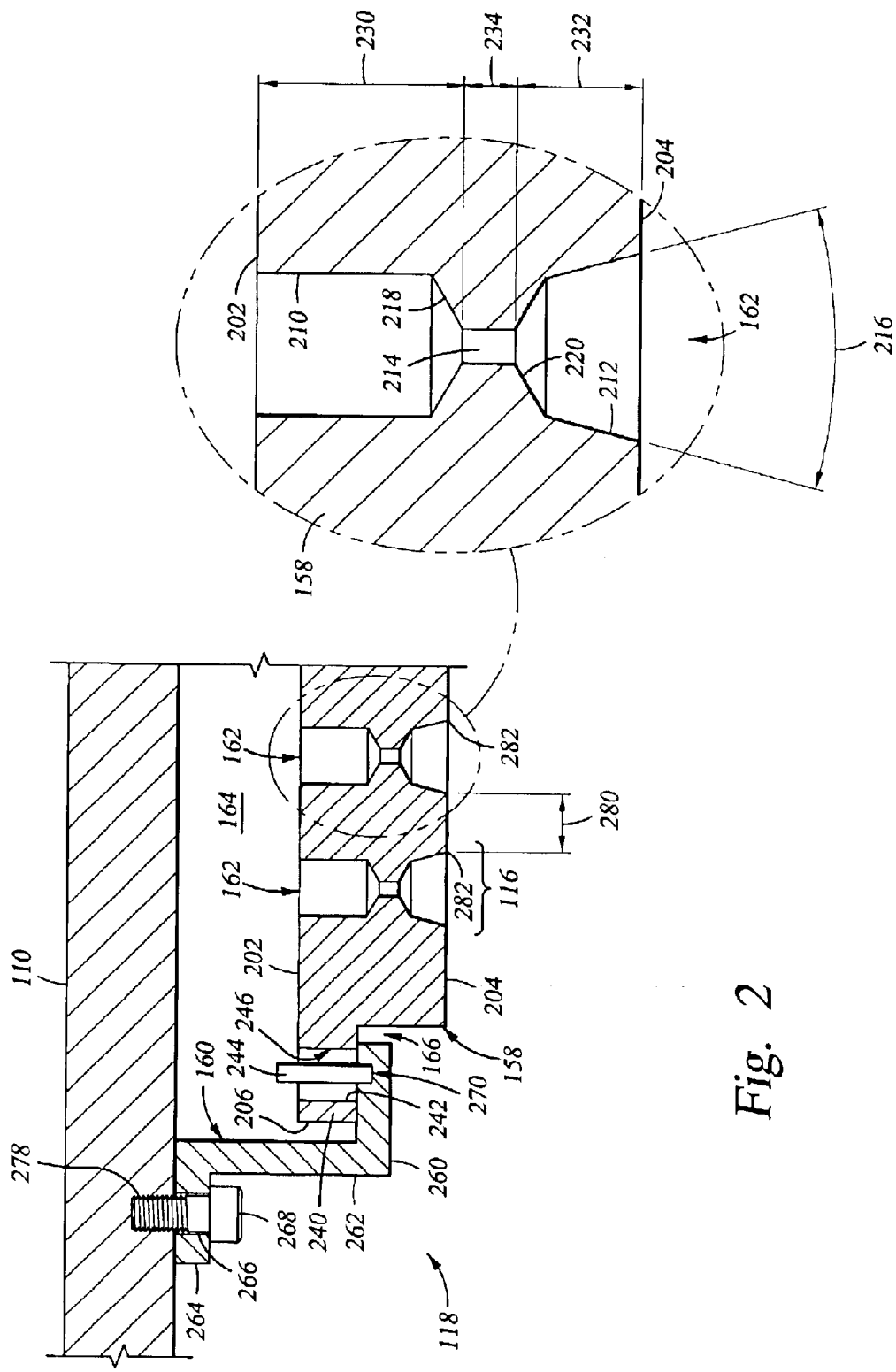
FIG. 2 is partial sectional view of the gas distribution plate assembly depicted in FIG. 1.

FIG. 2 is a partial sectional view of the diffuser plate 158. The diffuser plate 158 includes a first or upstream side 202 facing the lid assembly 110 and an opposing second or downstream side 204 that faces the support assembly 138. In one embodiment, the diffuser plate 158 is fabricated from aluminum and anodized on at least the downstream side 204. Anodization on the downstream side 204 has been found to enhance plasma uniformity. The upstream side 202 may be optionally free from anodization to limit the absorption of fluorine during cleaning, which may later be released during processing and become a source of contamination.

In one embodiment, each gas passage 162 is defined by a first bore 210 coupled by an orifice hole 214 to a second bore 212 that combine to form a fluid path through the gas distribution plate 158. The first bore 210 extends a first depth 230 from the upstream side 202 of the gas distribution plate 158 to a bottom 218. The bottom 218 of the first bore 210 may be tapered, beveled, chamfered or rounded to minimize the flow restriction as gases flow from the first bore into the orifice hole 210. The first bore 210 generally has a diameter of about 0.093 to about 0.218 inches, and in one embodiment is about 0.156 inches.

The second bore 212 is formed in the diffuser plate 158 and extends from the downstream side 204 to a depth 232 of about 0.250 to about 0.375 inches. The diameter of the second bore 212 is generally about 0.187 to about 0.375 inches and may be flared at an angle 216 of about 22 to at least about 35 degrees. In one embodiment, the second bore 212 has a diameter of 0.320 inches and the flare angle 216 is about 35 degrees. In another embodiment, a distance 280 between rims 282 of adjacent second bores 212 is about 25 to about 85 mils. The diameter of the first bore 210 is usually, but not limited to, being at least equal to or smaller than the diameter of the second bore 212. A bottom 220 of the second bore 212 may be tapered, beveled, chamfered or rounded to minimize the pressure loss of gases flowing out from the orifice hole 214 and into the second bore 212. Moreover, as the proximity of the orifice hole 214 to the downstream side 204 of the serves to minimize the exposed surface area of the second bore 212 and the downstream side 204 that face the substrate, the downstream area of the diffuser plate 158 exposed to fluorine provided during chamber cleaning is reduced, thereby reducing the occurrence of fluorine contamination of deposited films.

The orifice hole 214 generally couples the bottom 218 of the first hole 210 and the bottom 220 of the second bore 212. The orifice hole generally has a diameter of about 0.25 to about 0.76 mm (about 0.02 to about 0.3 inches), and typically has a length 234 of about 0.040 to about 0.085 inches. The length 234 and diameter (or other geometric attribute) of the orifice hole 214 is the primary source of back pressure in the plenum 164 which promotes even distribution of gas across the upstream side 202 of the gas distribution plate 158. The orifice hole 214 is typically configured uniformly among the plurality of gas passages 162, however, the restriction through the orifice hole 214 may be configured differently among the gas passages 162 to promote more gas flow through one area of the gas distribution plate 158 relative to another area. For example, the orifice hole 214 may have a larger diameter and/or a shorter length 234 in those gas passages 262 closer to a perimeter 206 of the gas distribution plate 158 so that more gas flows through the edges of the perforated area 116 to increase the deposition rate at the perimeter of the glass substrate.

As the orifice hole 214 is relatively short in length 234 and positioned between the two larger diameter bores 210, 212, the orifice hole 214 may be efficiently fabricated in the gas distribution plate 158 with minimal probability of drill breakage. Thus, the gas distribution plate 158 of the present invention may be fabricated at a reduced cost as compared to conventional gas distribution plates where the expense of drill breakage and extraction from the distribution plate is a common occurrence over the thousands the gas passages formed in the perforated area. Moreover, as the surface area of the upstream side 202 of the gas distribution plate 158 directly exposed to cleaning agents entering through the lid assembly 110 is considerably less than conventional gas distribution plates having gas flow orifices formed directly in the upstream side of the plate, anodized gas distribution plates 158 have a diminished propensity for retaining fluorine over the course of cleaning cycles, thereby reducing the amount of fluorine that may be released during processing.

The total restriction provided by the orifice holes 214 directly effect the backpressure upstream of the diffuser plate 158, and accordingly should be configured to prevent re-combination of disassociated fluorine utilized during cleaning. In that regard, the orifice hole diameter should be balanced against the number of holes. While the orifice hole diameter may be increase to allow fewer holes to be utilized and the realization of diminished manufacturing costs, the spacing between the rims 282 of adjacent second bores 212 may be selected in the lower range of between about 25 to about 50 mils to achieve deposition uniformity performance comparable to conventional diffuser plates having greater gas flow hole density.

In the embodiment depicted in FIG. 2, the hanger plate 160 and the diffuser plate 158 may be coupled in a manner that facilitates thermal expansion and contraction of the diffuser plate 158 without warpage, distortion or adversely stressing the diffuser plate 158 in a manner that would affect the uniformity of gas flow through the gas distribution plate assembly 118. In one embodiment, the hanger plate 160 is a polygonal frame that includes a first flange 264 that extends outward from a main body 262 and a second flange 260 that extends inward in the opposite direction of the first flange 264. Alternatively, the hanger plate 160 may be a flanged cylinder. The first flange 264 includes a plurality of mounting holes 266, each of which aligning with a threaded hole 278 formed in the lid assembly 110. Vented fasteners 268 are respectively passed through the mounting hole 266 and threaded into the threaded hole 278 to secure the hanger plate 160 to the lid assembly 110.

The second flange 260 includes a plurality of holes 270 formed therein that respectively retain a dowel pin 244. The dowel pins 244 (one is shown in FIG. 2) extend upward from the second flange 260 toward the first flange 262 and the interior surface 120 of the lid assembly 110. Holes or slots 246 formed through the diffuser plate 158 are adapted to respectively accept a pin 244.

Figure 4:
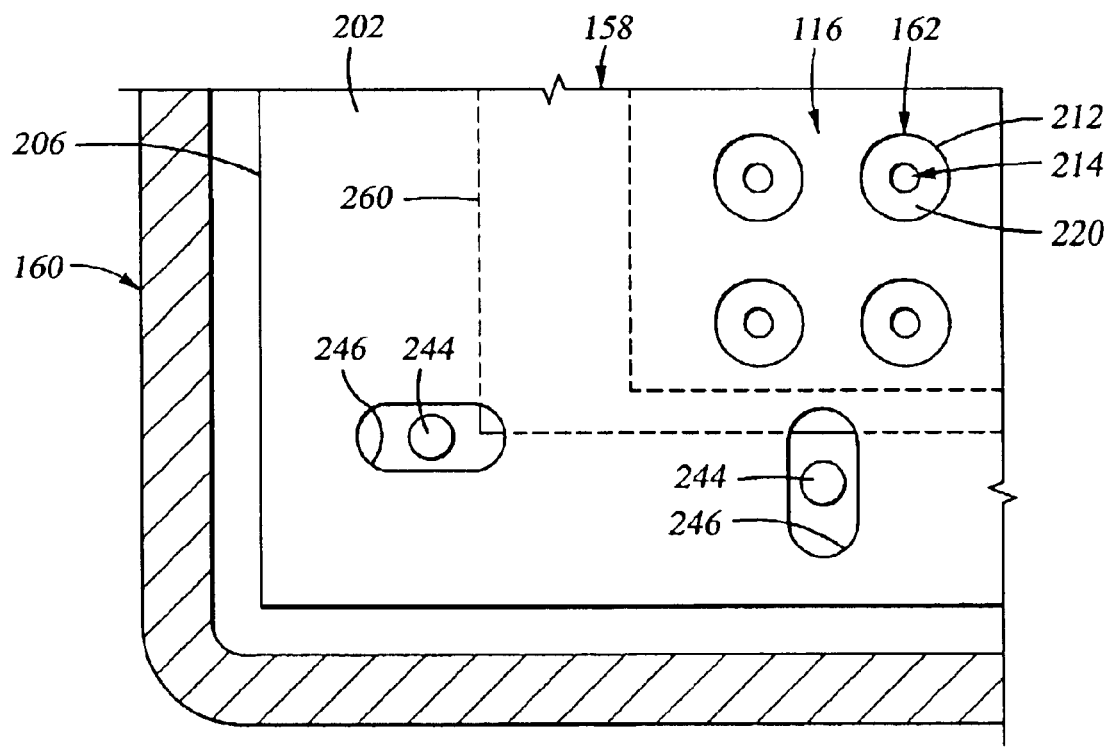
FIG. 4 is a partial top view of the gas distribution plate assembly of FIG. 2.

Referring additionally to the partial sectional top view of the hanger plate 160 shown in FIG. 4, the slots 246 in the diffuser plate 158 are large enough with respect to the dowel pins 244 to allow the diffuser plate 158 to move relative to the dowel pins 244, thereby facilitating compensation for differences in thermal expansion between the diffuser plate 158, the hanger plate 160 and the lid assembly 110. As depicted in FIG. 4, the slots 246 are typically oriented along each side of the diffuser plate 158 in orthogonal directions to accommodate expansion of the plate assembly 118 along two axes. Alternatively, the slots 246 may be configured radially for circular gas distribution plates. Thus, as the distribution plate assembly 118 heats and cools, the diffuser plate 158 is free to move relative to the lid assembly 110 and thereby remains free from warpage or other stresses that may cause the distribution plate assembly 118 to distort or otherwise alter the pattern of gases flowing through the distribution plate assembly 118. Alternatively, slots may be formed in the hanger plate 160 to accept pins extending from the diffuser plate 158.

Figure 5:
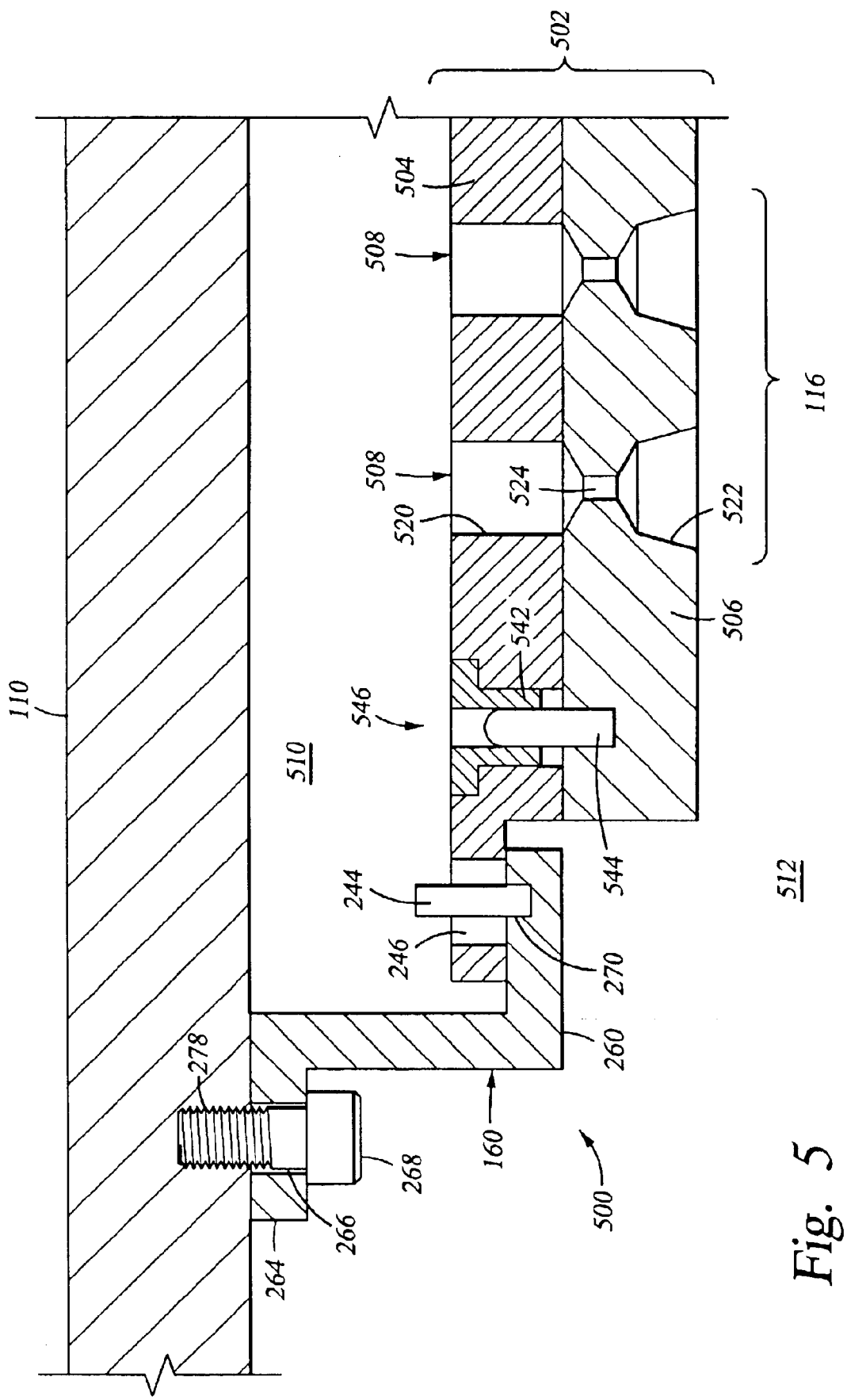
FIG. 5 is a partial sectional view of another embodiment of a gas distribution plate assembly that includes a diffuser assembly.

FIG. 5 is a partial sectional view of another embodiment of a gas distribution plate assembly 500. The gas distribution plate assembly 500 includes a hanger plate 160 and a diffuser plate assembly 502 mounted to a lid assembly 110 similar to as described above. The diffuser plate assembly 502 includes a tuning plate 504 coupled to a diffuser plate 506. A plurality of gas passages 508 are formed through the tuning plate 504 and diffuser plate 506 to distribute gases from a plenum 510 defined between the gas distribution plate assembly 500 and the lid assembly 110 to the processing area 512 of a processing chamber.

The gas passages 508 are configured similar to the gas passages 162 described above, except that an upstream portion of each gas passage 508 is formed through the tuning plate 504 while a downstream portion is formed in the diffuser plate 506. For example, at least a portion of a first bore 520 is formed in the tuning plate 504 while at least a portion of a second bore 522 is formed in the diffuser plate 506. An orifice hole 524 that fluidly couples the first and second bores 520, 522 may be formed at least partially in at least one of the tuning plate 504 or the diffuser plate 506.

In the embodiment depicted in FIG. 5, the first bore 520 is formed through the tuning plate 504 and partially in the diffuser plate 506. The second bore 522 and orifice hole 524 are formed the diffuser plate 506. Fabrication of the bores and holes 520, 522, 524 separately in each plate 504, 506 allows for more efficient fabrication as drilled length and depth (i.e, position within a plate) of the orifice hole 524 is minimized, further reducing the occurrence of drill bit breakage, thus further reducing fabrication costs.

A plurality of locating features 546 are disposed between the tuning plate 504 and the diffuser plate 506 to ensure mating and alignment of the portions of the gas passages 508 formed in the tuning plate 504 and the diffuser plate 506. In one embodiment, the locating features 546 are a plurality of locating pins 544 (one of which is shown) disposed between the tuning plate 504 and the diffuser plate 506. In the embodiment depicted in FIG. 5, the locating pins 544 extend from the diffuser plate 506 and engage a mating bushing 542 that is press-fit in an opening through the tuning plate 504. The pins 544 may be positioned so that alignment of the gas passages 508 and predefined orientation between the tuning plate 504 and diffuser plate 506 relative to the lid assembly 110 is assured. The tuning plate 504 and diffuser plate 506 may be fastened together in any number of manners, including fasteners, rivets, screws, brazing, welding, adhesives, clamps and the like.

Figure 6:
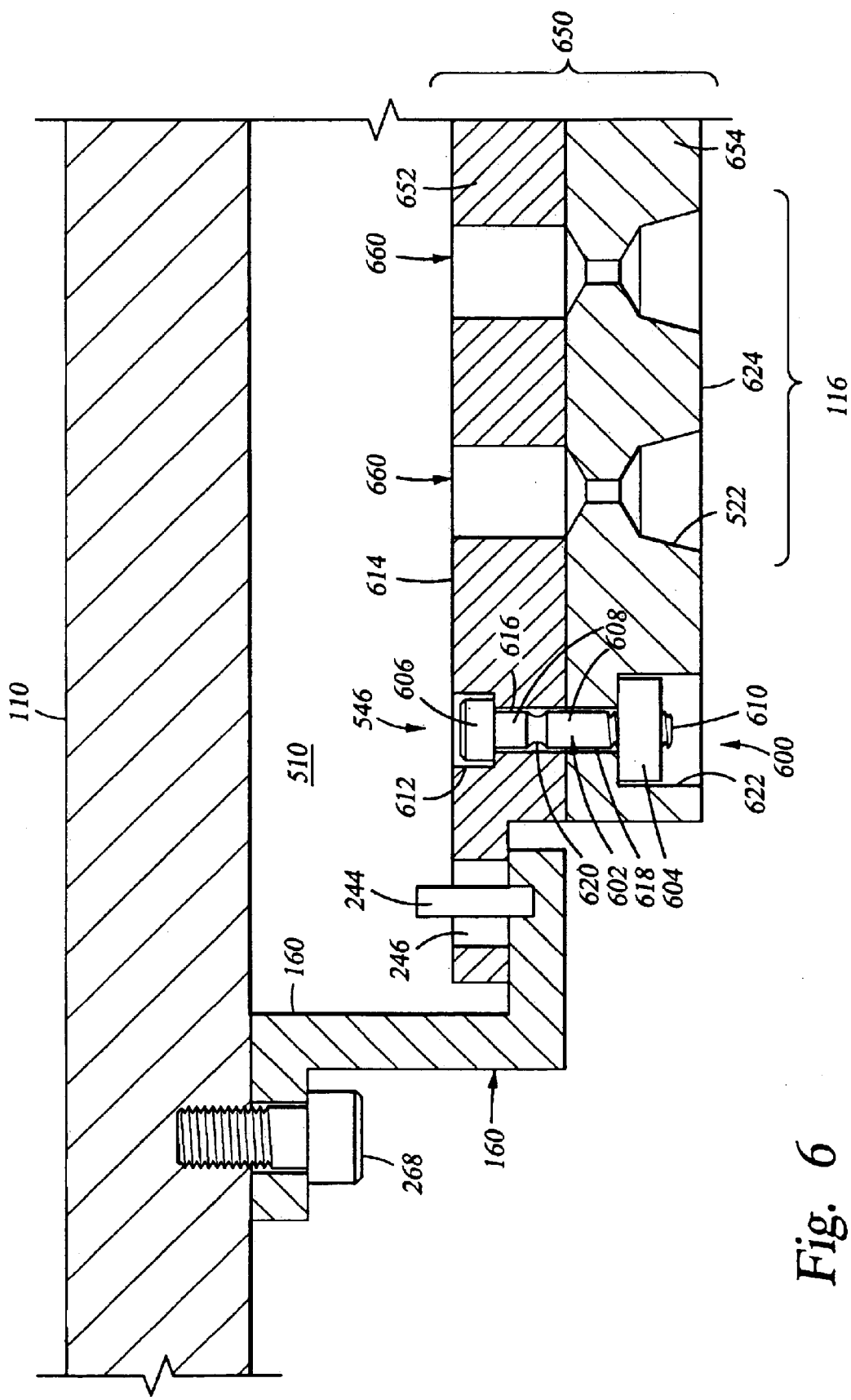
FIG. 6 depicts another partial sectional view of one embodiment of the gas distribution plate assembly of FIG. 5.

FIG. 6 is partial sectional view of another embodiment of a diffuser distribution plate assembly 650 that includes a plurality of gas passages 660 that are formed through a tuning plate 652 and a diffuser plate 654, where the turning plate 652 is removably fastened to the diffuser plate 654. In the embodiment depicted in FIG. 6, the tuning plate 652 and diffuser plate 654 are coupled at regular intervals by a breakaway fastener system 600 (one is shown in FIG. 6). The gas passages 660 are configured similar to the gas passages 508 described above.

Each of the breakaway fastener systems 600 includes a fastener 602 and a mating nut 604, both of which are typically fabricated from aluminum or other suitable material. In applications where it is advantageous to use aluminum fasteners to minimize fastener material effects on processing, the breakaway fastener system 600 allows the tuning plate 652 and diffuser plate 654 to be separated where traditional aluminum fasteners would seize, requiring removal and re-threading of components. This allows the tuning plate 652 to be changed to alter the flow characteristics of the gas passages 660 thereby allowing the distribution plate assembly 650 to be tailored for a given process without having to change the entire assembly. This feature is discussed in detail in the previously incorporated U.S. patent application Ser. No. 10/337,483, filed Jan. 7, 2003 by Blonigan et al.

In one embodiment, the fastener 602 has a head 606, a shank 608 and a threaded portion 610. The head 606 is typically disposed in a counterbore 612 formed in a top surface 614 of the tuning plate 652. A hole 616 is formed through the tuning plate 652 concentrically to the counterbore 612 to accept the shank 608 of the fastener 602. The shank 608 passes through a hole 618 formed through the diffuser plate 654 that aligns concentrically with the hole 616. The shank 608 typically includes a necked portion 620 adapted to shear when the fastener 602 is subjected to a torque in excess of a predetermined amount.

The nut 604 is typically disposed in a slot 622 formed in a downstream side 624 of the diffuser plate 654 opposite the tuning plate 652. The slot 624 is in communication with the hole 618 formed through the diffuser plate 654. The shank 608 passes through the holes 616, 618 to expose the threaded portion 610 in the slot 622. The nut 602 disposed in the slot 622 is mated with the threaded portion 610 of the fastener 602. The slot 622 is configured to prevent the nut 604 from turning as the fastener 602 is tightened to urge the plates 652, 654 against each other. Additionally, the two-plate configuration of the diffuser plate assembly 650 further facilitates economical manufacture of the gas passages 660 by substantially decreasing the distance required to form the orifice hole 694 during fabrication, thereby further reducing the occurrence of drill breakage during fabrication.

Thus, a gas distribution plate assembly has been provided that is economical to fabricate. Furthermore, the gas distribution plate assembly provided advantageously allows gas flow characteristics to be adjusted by varying orifice hole configurations across the width of the plate and/or by one plate of the assembly.

Although several preferred embodiments which incorporate the teachings of the present invention have been shown and described in detail, those skilled in the art can readily devise many other varied embodiments that still incorporate these teachings.

What is claimed is:

1. A gas distribution plate assembly for a processing chamber, comprising a diffuser plate having an upstream side, a downstream side, and a plurality of gas passages passing between the upstream and downstream sides of the diffuser plate, wherein at least one of the gas passages has a cylindrical hole extending from the upstream side and having a first diameter, a flared hole concentric with the cylindrical hole extending from the downstream side having a second diameter, and an orifice hole fluidly coupling the cylindrical hole and the flared hole and having a diameter less than the first and second diameters.

2. The gas distribution plate assembly of claim 1, wherein the second hole is flared about 22 to at least about 35 degrees.

3. The gas distribution plate assembly of claim 1, wherein the upstream side is non-anodized aluminum and the downstream side is anodized.

4. The gas distribution plate assembly of claim 1, wherein the diffuser plate further comprises:
   a first plate having at least a portion of the cylindrical hole of the gas passage formed therein; and
   a second plate coupled to the first plate and having at least a portion of the flared hole of the gas passage formed therein.

5. The gas distribution plate assembly of claim 1 further comprising:
   a hanger plate having a substantially polygonal aperture and adapted to support the diffuser plate in a processing chamber.

6. The gas distribution plate assembly of claim 5, further comprising:
   a plurality of pins extending between the hanger plate and diffuser plate, at least one of the pins cooperating with a slot formed in one of the hanger plate or diffuser plate in a manner that accommodates differences in thermal expansion.

7. The gas distribution plate assembly of claim 1, wherein the diffuser plate is polygonal.

8. The gas distribution plate assembly of claim 1, wherein at least one of the orifice holes formed through the diffuser plate has a flow restricting attribute different than at least one of the other orifice holes.

9. The gas distribution plate assembly of claim 1, further comprising an RF power source coupled to the diffuser plate to ignite a plasma.

10. A gas distribution plate assembly for a processing chamber, comprising:
    a diffuser plate assembly having an upstream side and a downstream side, each of the upstream and downstream sides having a surface and a plurality of gas passages passing between the upstream and downstream sides of the diffuser plate assembly, wherein at least one of the gas passages has a cylindrical hole extending from the upstream side, an orifice hole fluidly coupled to a bottom of the cylindrical hole, and a flared second hole extending from the orifice hole to the downstream side, wherein a diameter of the orifice hole is less than the cylindrical and second holes; and
    a hanger plate having an inwardly extending flange defining an aperture, wherein the flange of the hanger plate is adapted to support the diffuser plate assembly.

11. The gas distribution plate assembly of claim 10, wherein the bottom of the cylindrical hole is at least one of tapered, beveled, rounded or chamfered.

12. The gas distribution plate assembly of claim 10, wherein the second hole is flared about 22 to at least about 35 degrees.

13. The gas distribution plate assembly of claim 10, wherein the downstream surface has an anodized coating and the upstream surface is un-anodized aluminum.

14. The gas distribution plate assembly of claim 10, wherein the downstream and upstream surfaces have an anodized coating.

15. The gas distribution plate assembly of claim 10, wherein the diffuser plate assembly further comprises:

a first plate having at least a portion of the first hole of the gas passage formed therein;

a second plate coupled to the first plate and having at least a portion of the second hole of the gas passage formed therein.

16. The gas distribution plate assembly of claim 10, wherein the diffuser plate assembly is aluminum.

17. The gas distribution plate assembly of claim 16 further comprising:

a plurality of pins extending between the hanger plate and diffuser plate, at least one of the pins positioned within a slot formed in one of the hanger plate or diffuser plate.

18. The gas distribution plate assembly of claim 10, wherein the diffuser plate is polygonal.

19. The gas distribution plate assembly of claim 18, wherein at least one of the orifice holes formed through the diffuser plate has a flow restricting attribute different than at least one of the other orifice holes.

20. A gas distribution plate assembly for a processing chamber, comprising:

a polygonal diffuser plate having an upstream side and a downstream side and a plurality of gas passages passing between the upstream and downstream sides of a center region of the diffuser plate, wherein at least one of the gas passages comprises a cylindrical first hole extending from the upstream side, a flared second hole concentric with the cylindrical first hole extending from the downstream side and having a diameter at least about equal to or greater than the diameter of the first hole, and an orifice hole coupling the first and second holes and having a diameter less than the first hole; and an RF power source coupled to the diffuser plate to ignite a plasma.

21. The gas distribution plate assembly of claim 20, wherein a spacing between flared edges of adjacent second holes is about 25 mils.

22. The gas distribution plate assembly of claim 20, wherein the upstream side and the downstream side of the diffuser plate define a thickness about of at least about 1.2 inches.

23. The gas distribution plate assembly of claim 20, wherein the first hole extending from the upstream side of the diffuser plate has a diameter of about 0.093 to about 0.218 inches.

* * * * *